United States Patent

Burrell, IV

Patent Number: 6,043,761
Date of Patent: *Mar. 28, 2000

[54] METHOD OF USING A NINE KEY ALPHANUMERIC BINARY KEYBOARD COMBINED WITH A THREE KEY BINARY CONTROL KEYBOARD

[76] Inventor: James W. Burrell, IV, P.O. Box 3822, Union, N.J. 07083

[*] Notice: This patent is subject to a terminal disclaimer.

[21] Appl. No.: 08/999,986

[22] Filed: Jul. 24, 1998

Related U.S. Application Data

[63] Continuation-in-part of application No. 08/898,727, Jul. 22, 1997.

[51] Int. Cl.[7] .................................................. H03K 17/94
[52] U.S. Cl. ........................ 341/23; 341/22; 379/93.18; 379/368; 708/146; 345/169
[58] Field of Search .................................. 379/368, 369, 379/370, 93.18; 341/22, 23; 345/169; 708/146, 145

[56] References Cited

U.S. PATENT DOCUMENTS

| | | | |
|---|---|---|---|
| 3,675,513 | 7/1972 | Flanagan et al. | 708/146 |
| 4,012,599 | 3/1977 | Meyer | 708/146 |
| 4,532,378 | 7/1985 | Nakayama et al. | 708/145 |
| 4,585,908 | 4/1986 | Smith | 708/146 |
| 4,918,721 | 4/1990 | Hashimoto | 379/93.18 |

*Primary Examiner*—Michael Horabik
*Assistant Examiner*—Timothy Edwards, Jr.
*Attorney, Agent, or Firm*—Ezra Sutton

[57] ABSTRACT

This invention relates to a novel way to use a twelve button telephone keypad for alphanumeric data entry. This invention also relates to a method of alphanumeric data entry using short duration or long duration binary key actuations using a simultaneous coding system and/or sequential coding system for communicating on a standard twelve key push-button telephone keypad. Two binary keys are used for an all capital letter mode or two binary keys for a lower-case letter mode, along with three binary keys for an upper-case letter mode, for producing full alphanumeric text, including punctuation, symbols and control.

24 Claims, 12 Drawing Sheets

(PRIOR ART)

FIG. 2A

| ALPHANUMERIC CHARACTER | CODING SEQUENCE |
|---|---|
| NUMERIC MODE | # |
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 0 | 0 |
| CLEAR ALL NUMERIC DATA | # |
| SEND | ### |
| 2-KEY ALPHABETIC MODE | * |
| A | 2* |
| B | 20 |
| C | 2# |
| D | 3* |
| E | 30 |
| F | 3# |
| G | 4* |
| H | 40 |
| I | 4# |
| J | 5* |
| K | 50 |
| L | 5# |
| M | 6* |
| N | 60 |

FIG. 2B

| | |
|---|---|
| O | 6# |
| P | 7* |
| Q | 1* |
| R | 70 |
| S | 7# |
| T | 8* |
| U | 80 |
| V | 8# |
| W | 9* |
| X | 90 |
| Y | 9# |
| Z | 1# |
| SPACE | 10 OR 00 |
| PERIOD | *0 |
| BACKSPACE (ERASE) CONTINUE | ** |
| PUNCTUATION MODE 1-0 | *# (+ ENTRY) |
| ? | (*#) 1 |
| . | (*#) 2 |
| ! | (*#) 3 |
| " | (*#) 4 |
| ' | (*#) 5 |
| " | (*#) 6 |
| ( | (*#) 7 |
| ; | (*#) 8 |
| ) | (*#) 9 |
| : | (*#) 0 |
| NUMERIC MODE | #0 |
| ALPHABETIC MODE | * |
| SEND | ### |

FIG. 5A

| ALPHANUMERIC CHARACTER | CODING SEQUENCE |
|---|---|
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 0 | 0 |
| HYPHEN | *# |
| DECIMAL POINT | *0 |
| BACKSPACE | # |
| CLEAR ALL NUMERIC DATA | ## |
| SEND | ### |
| 2-KEY ALPHABETIC MODE | * |
| A | 2* |
| B | 20 |
| C | 2# |
| D | 3* |
| E | 30 |
| F | 3# |
| G | 4* |
| H | 40 |
| I | 4# |
| J | 5* |
| K | 50 |
| L | 5# |
| M | 6* |
| N | 60 |

FIG. 5B

| | |
|---:|:---|
| O | 6# |
| P | 7* |
| Q | 1* |
| R | 70 |
| S | 7# |
| T | 8* |
| U | 80 |
| V | 8# |
| W | 9* |
| X | 90 |
| Y | 9# |
| Z | 1# |
| SPACE | 10 OR 00 |
| TAB | 000 |
| PERIOD | *0 |
| BACKSPACE (ERASE) CONTINUE | ** |
| DELETE PREVIOUS WORD | *** |
| PUNCTUATION MODE 1-0 | *# (+ ENTRY) |
| ? | (*#) 1 |
| , | (*#) 2 |
| ! | (*#) 3 |
| " | (*#) 4 |
| ' | (*#) 5 |
| " | (*#) 6 |
| ( | (*#) 7 |
| ; | (*#) 8 |
| ) | (*#) 9 |
| : | (*#) 0 |
| NUMERIC MODE | #0 |
| 2-KEY ALPHABETIC MODE | * |
| 3-KEY ALPHABETIC MODE | ** |
| SEND (ENTER) | ### |

FIG. 6A

| ALPHANUMERIC CHARACTER | CODING SEQUENCE |
|---|---|
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 0 | 0 |
| HYPHEN | *# |
| DECIMAL POINT | *0 |
| BACKSPACE | # |
| CLEAR ALL NUMERIC DATA | ## |
| SEND | ### |
| 3-KEY ALPHABETIC MODE | ** |
| a | 2* |
| A | 2** |
| b | 20 |
| B | 200 |
| c | 2# |
| C | 2## |
| d | 3* |
| D | 3** |
| e | 30 |
| E | 300 |
| f | 3# |
| F | 3## |
| g | 4* |
| G | 4** |

FIG. 6B

| | | |
|---|---|---|
| | h | 40 |
| | H | 400 |
| | i | 4# |
| | I | 4## |
| | j | 5* |
| | J | 5** |
| | k | 50 |
| | K | 500 |
| | l | 5# |
| | L | 5## |
| | m | 6* |
| | M | 6** |
| | n | 60 |
| | N | 600 |
| | o | 6# |
| | O | 6## |
| | p | 7* |
| | P | 7** |
| | q | 1* |
| | Q | 1** |
| | r | 70 |
| | R | 700 |
| | s | 7# |
| | S | 7## |
| | t | 8* |
| | T | 8** |
| | u | 80 |
| | U | 800 |
| | v | 8# |
| | V | 8## |

FIG. 6C

| | |
|---|---|
| W | 9* |
| W | 9** |
| x | 90 |
| X | 900 |
| y | 9# |
| Y | 9## |
| z | 1# |
| Z | 1## |
| SPACE | 10 OR 00 |
| PERIOD | *0 |
| + | 22* |
| - | 77# |
| x | 66* |
| / | 33* |
| \ | 220 |
| = | 330 |
| % | 77* |
| ¿ | 11* |
| ¡ | 33# |
| ñ | 660 |
| Ñ | 6600 |
| ç | 22# |
| Ç | 22## |
| [ | 770 |
| ] | 990 |
| ▼ | 250 |
| ▲ | 850 |
| ▶ | 450 |
| ◀ | 650 |

FIG. 6D

| | |
|---|---|
| HOME | 550 |
| TAB | 110 |
| * | 88* |
| # | 88# |
| @ | 28* OR 280 |
| & | 260 |
| $ | 66# |
| SHIFT | 880 |
| TAB | 000 |
| BACKSPACE (ERASE) CONTINUE | ** |
| DELETE PREVIOUS WORD | *** |
| PUNCTUATION MODE 1-0 | *# (+ ENTRY) |
| ? | (*#) 1 |
| , | (*#) 2 |
| ! | (*#) 3 |
| " | (*#) 4 |
| ' | (*#) 5 |
| " | (*#) 6 |
| ( | (*#) 7 |
| ; | (*#) 8 |
| ) | (*#) 9 |
| : | (*#) 0 |
| NUMERIC MODE | #0 |
| 2-KEY ALPHABETIC MODE | * |
| 3-KEY ALPHABETIC MODE | ** |
| SEND (ENTER) | ### |

FIG. 7

CALL ME AT HOME AT 730PM AT 123-456-7890

Call me at work @ (123)-456-7890

```
   C  a  l  l     m  e        a  t     w  o  r  k
** 2## 2* 5# 5# 00 6* 30 10 2* 8* 00 9* 6* 70 50

@     11  :  30        A  M        @
10 280 00 #0 11 **  *#0 #0 30 ** 2** 6** 10 28* 00

123        )     -456 -7890
   123 ** *#9 #0 **#456*#7890
```

METHOD OF USING A NINE KEY ALPHANUMERIC BINARY KEYBOARD COMBINED WITH A THREE KEY BINARY CONTROL KEYBOARD

This patent application is a continuation of a provisional patent application, filed on the 8th day of April, 1997, entitled "ALPHANUMERIC TELEPHONY KEYPAD DATA ENTRY METHOD", now abandoned, which is shown in FIGS. 2A and 2B. The alphabetic code, excluding punctuation, shown in FIGS. 2A and 2B, was invented in August of 1972. Since 1972, the invention has never been disclosed until the filing of the provisional patent application. This patent application, filed Jul. 20, 1998, is a continuation-in-part of patent application Ser. No. 08/898,727 filed Jul. 22, 1997, pending, entitled "A NINE KEY ALPHANUMERIC BINARY KEYBOARD COMBINED WITH A THREE KEY BINARY CONTROL KEYBOARD AND COMBINATIONAL (SIMULTANEOUS AND/OR SEQUENTIAL) CONTROL MEANS". This continuation-in-part application is the completion in the development of the telephonic code for communicating on any standard twelve button telephone keypad, which replaces the TTY/TDD.

FIELD OF THE INVENTION

This invention relates to a novel way to use twelve button telephone keypad labeling arrangement for alphanumeric data entry. This invention also relates to a method of alphanumeric data entry using short duration or long duration binary key actuations using a simultaneous coding system and/or sequential coding system for communicating on a standard twelve key push-button telephone keypad. Two binary keys are used for an all capital letter mode or two binary keys for a lower-case letter mode, along with three binary keys for an upper-case letter mode, for producing full alphanumeric text, including punctuation, symbols and control. This a TTY/TDD replacement computer terminal invention would be properly classified in the U.S. Patent classification system under:

| | CLASS 379 TELEPHONIC COMMUNICATIONS and subclasses; |
|---|---|
| /52 | INCLUDING AID FOR HANDICAPPED USER (E.G., VISUAL, TACTILE, HEARING AID COUPLING), |
| /56 | HAVING ELECTROMAGNETIC LINK FOR SPEECH OR PAGING SIGNAL (E.G., LIGHT WAVE LINK), |
| /57 | . Control of selectively responsive paging arrangement over telephone line, |
| /58 | . Radio telephone system or instrument, |
| /59 | . . Zoned or cellular system, |
| /61 | . . Including cordless extension set (i.e., having single subscriber line access), |
| /63 | . . Including supervisory or control signaling, |
| /90 | TELEPHONE LINE OR SYSTEM COMBINED WITH DIVERSE ELECTRICAL SYSTEM OR SIGNALING (E.G., COMPOSITE), |
| /93 | . With transmission of digital message signal over a telephone line, |
| /97 | . . By voice frequency signal (e.g., tone code), |
| /98 | . . . By modulated audio tone, |
| /100 | . To produce visual-graphic copy reproduction (e.g., facsimile), |
| /105 | . . From terminal, |
| /108 | . Telegraphy, |
| /109 | . . Over telephone line, |
| /350 | SUPERVISORY OR CONTROL LINE SIGNALING, |
| /372 | . Signal reception at substation, |
| /419 | TERMINAL, |
| /428 | . Housing or housing component, |
| /434 | . . Specified terminal configuration (e.g., novelty type). |

The code part of this invention belongs in:

| | CLASS 341 CODED DATA GENERATION OR CONVERSION and sub-classes; |
|---|---|
| /1 | DIGITAL PATTER READING TYPE CONVERTER, |
| /3 | . Plural types of codes on a single carrier, |
| /9 | . Having combined (e.g., denominational, combinational code) coding pattern, |
| /17 | . Actuated by physical projection, |
| /20 | BODILY ACTUATED CODE GENERATOR, |
| /21 | . For handicapped user, |
| /22 | . Including keyboard or keypad, |
| /23 | . . Variable key legends, |
| /30 | . . For numerical pulse type transmission, |
| /34 | . Pressure sensitive actuation, |
| /50 | DIGITAL CODE TO DIGITAL CODE CONVERTERS, |
| /56 | . To or from multi-level codes, |
| /57 | . . Binary to or from ternary, |
| /64 | . To or from number or pulses, |
| /67 | . To or from variable length codes, |
| /82 | . To or from mixed code formats, |
| /90 | . To or from alphanumeric code formats, |
| /106 | . Coding from table look-up techniques. |

This invention also belongs in:

| | CLASS 364 ELECTRICAL COMPUTERS AND DATA PROCESSING SYSTEMS and sub-classes; |
|---|---|
| /130 | DATA PROCESSING CONTROL SYSTEMS, METHODS OR APPARATUS, |
| /140 | . Sequential or selective, |
| /141 | . . State of condition or parameter (e.g., on/off), |
| /142 | . . . Position responsive, |
| /180 | . Multiple modes (e.g., digital/analog), |
| /188 | . With operator control interface (e.g., control/display console), |
| /189 | . . Keyboard, |
| /221 | . Control systems, |
| /221.6 | . . Multiple mode, |
| /222.2 | . Communication/data transmission, |
| /222.3 | . . Telephone exchange, |
| | OPERATIONAL CONTROL |
| /260 | . Data transfer, |
| /260.1 | . . external, |
| /262.4 | . Instructional sequence, |
| /262.9 | . . Other specific instruction sequence operation, |
| /400 | APPLICATIONS, |
| /419.1 | . Word processing, |
| /419.14 | . . Replacement for characters or words, |
| /419.16 | . . Multilingual, |
| /419.17 | . . Editing (i.e., deletion, insertion, blocking, hyphenation, punctuation or footnotes), |
| /514 R | . Communication engineering, |
| /600 | ELECTRIC HYBRID COMPUTER, |
| /602 | . Specialized function performed, |
| /605 | . . Integration or differentiation, |
| /700 | ELECTRICAL DIGITAL CALCULATING COMPUTER, |
| /705.01 | . Combined with diverse art device, |
| /705.05 | . . Communication device (e.g., telephone, radio, television), |
| /709.01 | . With specialized input, |
| /709.08 | . . Flexible input, |
| /709.12 | . . Including specific keyboard type information entry, |
| /709.16 | . . . Key sequencing (i.e., sequence defines function), |
| /710.01 | . With specialized output, |
| /710.08 | . . Selective output, |
| /710.09 | . . Sequential output, |
| /710.1 | . . Using particular format, |
| | APPLICATIONS |
| /916.2 | . . Learning/trainable, |
| /919 | . Communications/data transmission system, |
| /919.4 | . . Telephone, |
| /919.5 | . . Other specific communications application, |
| | GENERIC DEVICE |
| /926 | . Analog input/output, |
| /926.7 | . . Character generator, |
| /933.9 | . Terminal. |

DESCRIPTION OF PRIOR ART

The twelve button touch-tone telephone keypad arrangement and twelve pairs of tones produced by independently depressing any one of the twelve buttons have become the standard throughout the world. Since the advent of the twelve key push-button telephone arrangement, many have tried to produce alphanumeric text and control means using only twelve buttons. In the telephony industry, the twelve binary key (four high/three wide) push-button telephone keypad arrangement with twenty-four letters of the alphabet, excluding the "Q" and "Z", arranged in groups of threes, located on the faces of the keys numbered two "2" through nine "9", or the twenty-six letters of an alphabet arranged in groups of threes, located on the faces of the keys numbered one "1" through nine "9" has become the world standard. The actuation of any one of the twelve binary keys, produces an analog, dual tone multifrequency signal (DTMF), which is a combination of two analog voice frequency tones. The telephone system hardware then converts the analog DTMF tones into a digital signal for processing, digital phones being the exception. In the past, the "Q" and "Z" have been located on the face of the keys in a few different locations. The most common way in the past, is where the "Q" and "Z" are located on the "1" key. Usually the "Q" and "Z" are located next to each other above the "1".

U.S. Pat. No. 3,675,513 to James Flanagan, et al. discloses a communication system for exchanging alphanumeric information. Flanagan positions from left to right; The "Q", "Z" and period "." on the "1" key. The "Q" is produced by actuating the "1" key, followed by the actuation of the "0" key. The "Z" is produced by actuating the "1" key twice, followed by the actuation of the "0" key. The period "." is produced by actuating the "1" key three times, followed by the actuation of the "0" key.

U.S. Pat. No. 4,012,599 to Jerome Meyer discloses a communicator and encoding scheme. Meyer positions from left to right; The period ".", "Q" and "Z" on the "1" key. The period "." is produced by actuating the "*" key, followed by the actuation of the "1" key. The "Q" is produced by actuating the "0" key, followed by the actuation of the "1" key. The "Z" is produced by actuating the "#" key, followed by the actuation of the "1" key.

U.S. Pat. No. 4,427,848 to Peter Tsakanikas discloses an alphanumeric data transmission system. Tsakanikas positions from left to right; the "Q", "Z" and hyphen "-" on the "1" key, although there is no coding scheme to layout to figure out actuation combinations for data representation. Single actuation is used for the left data position, double actuation is used for the middle data position and triple actuation is used for the right data position to produce the desired alphabetic data.

U.S. Pat. No. 4,440,977 to John Pao, et al. discloses a sequential twelve key apparatus. Pao positions from left to right; the period ".", "Q" and "Z" on the "1" key. The period "." is produced by actuating the "1" key, followed by the actuation of the "*" key. The "Q" is produced by actuating the "1" key, followed by the actuation of the "0" key. The "Z" is produced by actuating the "1" key, followed by the actuation of the "#" key.

U.S. Pat. No. 4,532,378 to Yasunoba Nakayama, et al. discloses a telephone apparatus for alphanumeric data entry. Nakayama positions from left to right; the "Q", "Z" and period "." on the "1" key. Single key actuation for the left data position, double actuation for the middle data position and triple actuation for the right data position, followed by the actuation of the "0" key, to produce the desired alphabetic data.

U.S. Pat. No. 4,585,908 to Louis Smith discloses a data entry and display circuit. Smith represents from left to right; the "Q", a "(blank)" and a "Z" on the "1" key. The "Q" is produced by actuating the "1" key, followed by the actuation of the "#" key. The unfilled data position between the "Q" and "Z", referred to as "(blank)", is not used for anything. The "Z" is produced by actuating the "1" key, followed by the actuation of the "#" key. In Smith's patent application explanation, all numbers require double actuation of the numeric key to produce a number. Unlike this present invention and application, numeric data is produced by single number key actuations, while in a single key number mode. Smith also does not explain or claim a space, only cursor movement, and claims a circuit requiring an actuation of a key for an unspecified predetermined duration, along with a second key actuation, with a second unspecified predetermined duration of actuation. There is no conflict in what Smith claims in U.S. Pat. No. 4,585,908, to what is claimed in this patent application.

U.S. Pat. No. 4,650,927 to Leland James discloses a processor-assisted system for communicating using a telephone. James positions from left to right; the "Q" and "Z" on the "1" key. The "Q" is produced by actuating the "1" key. The "Z" is produced by actuating the "1" key. When the alphabetic word is completed, the user actuates the "*" key as a space, which sends the alphabetic data word to a computer to decipher what the word is.

U.S. Pat. No. 4,674,112 to George Kondraske, et al. discloses a communication apparatus including a method of use. Kondraske positions from left to right; the "Q", "Z" and apostrophe "'" on the "1" key. The "Q" is produced by actuating the "1" key. The "Z" is produced by actuating the "1" key. When the alphabetic word is completed, the user actuates the "*" key as a space, which sends the alphabetic data word to a computer to decipher what the word is.

U.S. Pat. No. 4,737,980 to William Curtin, et al. discloses a method and apparatus for inputting data into a computer. Curtin positions from left to right; the "Q", "Z" and a box(?) on the "1" key. Three alphabetic letters and the number on the key face are all represented by the same key actuation. A predetermined probability algorithm guesses what type of data the user entered into the phone/computer terminal.

U.S. Pat. No. 4,918,721 to Kazuo Hashimoto discloses a phone capable of producing upper-case and lower-case letters. Hasimoto positions from left to right; the "Q", "Z" and "space" on the number "1" key. Two methods of data entry are disclosed. In the first, the "Q" is produced by actuating the "#" key, followed by the actuation the "1" key. The "Z" is produced by actuating the "#" key twice, followed by the actuation of the "1" key. The "space" is produced by actuating the "#" key three times, followed by the actuation of the "1" key. In the second method of data entry, the "Q" is produced by actuating the "1" key twice, followed by the actuation of the "#" key. The "q" is produced by actuating the "1" key twice, followed by the actuation of the "*" key. The "Z" is produced by actuating the "1" key three times, followed by the actuation of the "#" key. The "z" is produced by actuating the "1" key three times, followed by the actuation of the "*" key. The space " " is produced by actuating the "1" key four times, followed by the actuation of the "#" key.

U.S. Pat. No. 5,392,338 to Adel Danish, et al. discloses a method for entering alphabetic characters into a telephone apparatus. Danish et al. represents from left to right; the "Q" and "Z" on the "1" key. The "Q" is produced by actuating the "1" key. The "Z" is produced by actuating the "1" key twice. Numbers must be entered individually, followed by the activation of the "#" key.

U.S. Pat. No. 3,647,973 to James et al., U.S. Pat. No. 4,005,388 to Morley et al., U.S. Pat. No. 4,007,443 to Bromberg et al., U.S. Pat. No. 4,191,854 to Coles, U.S. Pat. No. 4,307,266 to Messina, U.S. Pat. No. 4,426,555 to Underkoffler, U.S. Pat. No. 4,608,457 to Fowler et al., U.S. Pat. No. 4,825,464 to Wen, are additional prior art patents where the "Q" and "Z" are represented or located on the "0" key.

U.S. Pat. No. 3,526,892 to Bartlett et al., U.S. Pat. No. 3,573,376 to Bartlett et al., U.S. Pat. No. 3,618,038 to Stein, U.S. Pat. No. 3,746,793 to Sachs, U.S. Pat. No. 3,833,765 to Hillborn et al., U.S. Pat. No. 3,870,821 to Steury, U.S. Pat. No. 3,879,722 to Knowlton, U.S. Pat. No. 3,967,273 to Knowlton, U.S. Pat. No. 4,304,968 to Klausner et al., U.S. Pat. No. 4,344,069 to Prame, U.S. Pat. No. 4,381,502 to Prame, U.S. Pat. No. 4,500,751 to Darland et al., U.S. Pat. No. 4,649,563 to Risken, U.S. Pat. No. 4,658,417 to Hashimoto et al., U.S. Pat. No. 4,677,659 to Dargan, U.S. Pat. No. 4,817,129 to Risken, U.S. Pat. No. 4,988,997 to Prame, U.S. Pat. No. 5,117,455 to Danish, U.S. Pat. No. 5,163,084 to Kim et al., U.S. Pat. No. 5,303,288 to Duffy et al., U.S. Pat. No. 5,339,358 to Danish et al., U.S. Pat. No. 5,486,823 to Tsai, U.S. Pat. No. 5,548,634 to Gahang et al., U.S. Pat. No. 5,559,512 to Jasinski et al., disclose prior art patents that use the phone keypad to enter alphanumeric data.

U.S. Pat. No. 2,073,333 to Chireix, U.S. Pat. No. 3,381,276 to James, U.S. Pat. No. 3,582,554 to LeBlang, U.S. Pat. No. 3,778,553 to Rackman, U.S. Pat. No. 4,481,508 to Kamei et al., U.S. Pat. No. 4,486,741 to Nozawa et al., U.S. Pat. No. 4,680,278 to Davis,II et al., U.S. Pat. No. 4,724,423 to Kinoshita, U.S. Pat. No. 4,799,254 to Dayton et al., U.S. Pat. No. 4,860,234 to Lapeyre, U.S. Pat. No. 4,891,777 to Lapeyre, U.S. Pat. No. 4,910,697 to Lapeyre, U.S. Pat. No. 4,924,431 to Lapeyre, U.S. Pat. No. 4,999,795 to Lapeyre, U.S. Pat. No. 5,007,008 to Beers, U.S. Pat. No. 5,031,119 to Dulaney et al., U.S. Pat. No. 5,062,070 to Lapeyre, U.S. Pat. No. 5,067,103 to Lapeyre, U.S. Pat. No. 5,105,375 to Lapeyre, U.S. Pat. No. 5,124,940 to Lapeyre, U.S. Pat. No. 5,184,315 to Lapeyre, U.S. Pat. No. 5,274,693 to Waldman, U.S. Pat. No. 5,581,593 to Engelke et al., disclose other prior art patents.

With the advent of the alphanumeric pager and the transference of alphanumeric data using the standard twelve key telephone, a way of eliminating a data entry operator is needed. This invention solves the problem of twelve button alphanumeric simultaneous and/or sequential coding for full alphanumeric text data entry.

SUMMARY OF THE INVENTION

This invention uses any standard twelve key push-button phone keypad arrangement to produce full alphanumeric text, including a space, punctuation, symbols and control. The differences in the present invention are the keyboard arrangement and the system and method of producing twenty-six letters of an alphabet or data characters, such as Chinese or Japanese, and a space on a standard twelve key pushbutton phone arrangement. The preferred telephone keypad labeling embodiment, has the letters "Q" and "Z" are produced by the preferred number "1" key, with a "space" positioned between the "Q" and "Z", the "ABC" on the preferred "2" key, the "DEF" on the preferred "3" key, the "GHI" on the preferred "4" key, the "JKL" on the preferred "5" key, the "MNO" on the preferred "6" key, the "PRS" on the preferred "7" key, the "TUV" on the preferred "8" key and the "WXY" on the "9" key. The "ABC" could be on the "1" key or on any other key. As long as any twenty-six alphabetic characters and a space are produced by nine binary keys numbered one "1" through nine "9" combined with first, second or third binary control key, of a three key binary control keyboard, producing a first, second or third data character on each binary key of a first set of nine binary keys, while in an alphabetic mode.

Numbers are produced in the number mode by the single key activations presently used throughout the world today.

To produce a hyphen "-" between numbers, which are found in phone numbers, while in the number mode, the first left preferred asterisk "*" binary control key is combined with the activation, either simultaneously with or followed by the activation of the third right preferred number "#" binary control key.

To produce a decimal point "." found between numbers, while in the number mode, the first left preferred asterisk "*" binary control key is combined with the activation, either simultaneously with or followed by the activation of the second middle preferred zero "0" binary control key.

To produce a backspace while in the number mode, the third right preferred number "#" binary control key is activated once, when it is not followed by the activation of a first binary control key or a second binary control key,.

To delete all previously entered numeric data while in the number mode, the third right preferred number "#" binary control key is activated, when it is not followed by the activation of a first binary control key or a second binary control key, followed by the secondary activation of the third right preferred number "#" binary control key, when it is not followed by the activation of a first binary control key or a second binary control key,.

Activation of the third right preferred number "#" binary control key three times, while in the number mode or alphabet mode, produces the "ENTER/RETURN/SEND" function.

Activation of the first left preferred asterisk "*" binary control key, while in the number mode, when not followed by the activation of second middle preferred zero "0" binary control key or the activation of the third right preferred number "#" binary control key, exits the number mode and enters a two key upper-case alphabet mode.

Activation of the first left preferred asterisk "*" binary control key followed by the secondary activation of the first left preferred asterisk "*" binary control key, when not followed by the activation of second middle preferred zero "0" binary control key or the activation of the third right preferred number "#" binary control key, while in the number mode, exits the number mode and enters a two key lower-case alphabet mode and a three key upper-case alphabet mode, where the secondary activation of the binary control key produces the upper-case character.

When the first left preferred asterisk "*" binary control key is depressed once while in the number mode, the apparatus enters into a two key continuous upper-case alphabet mode to produce up to twenty-six letters or characters of an alphabet and a space. Depressing the binary key of a first set of nine binary keys, with the desired alphabetic data, combined with the simultaneous activation or followed by the activation of the first left preferred asterisk "*" binary control key produces the first left position data character, the second middle preferred zero "0" binary control key produces the second middle position data character, or the third right preferred number "#" binary control key produces the third right position data character. The two key preferred embodiment is shown in FIGS. 5A and 5B.

When the first left preferred asterisk "*" binary control key is depressed once while in the number mode, followed by the secondary activation the first left preferred asterisk "*" binary control key, the apparatus enters into a two key lower-case and three key upper-case alphabetic mode, to produce twenty-six lower-case letters or characters of an alphabet and a space and twenty-six upper-case letters or characters of an alphabet and a space. Depressing the binary key of a first set of nine binary keys, with the desired alphabetic data, combined with the simultaneous activation or followed by the activation of the first left preferred asterisk "*" binary control key produces the first left position data character, where the secondary activation of the binary control key produces the upper-case character the second middle preferred zero "0" binary control key produces the second middle position data character, where the secondary activation of the binary control key produces the upper-case character, or the third right preferred number "#" binary control key produces the third right position data character, where the secondary activation of the binary control key produces the upper-case character. The two key lower-case and three key upper-case preferred embodiment is shown in FIGS. 6A through 6D.

Activation of the second middle preferred zero "0" binary control key, while in the alphabetic mode, followed by the secondary activation of the second middle preferred zero "0" binary control key, produces a space.

Activation of the second middle preferred zero "0" binary control key three times successively, while in the alphabetic mode, produces the "TAB" function.

Activation of the first left preferred asterisk "*" binary control key, while in the alphabetic mode, followed by the secondary activation of the first left preferred asterisk "*" binary control key, deletes the previously entered alphabetic or punctuation bit of data, otherwise known as the backspace. Activation of the first left preferred asterisk "*" binary control key three times successively, while in the alphabetic mode, deletes the previously entered word. Activation of the first left preferred asterisk "*" binary control key, while in the alphabetic mode, combined with the activation, either simultaneously with or followed by the activation of the second middle preferred zero "0" binary control key, produces a period ".". Activation of the first left preferred asterisk "*" binary control key, while in the alphabetic mode, combined with the activation, either simultaneously with or followed by the activation of the third right preferred number "#" binary control key, enters a one-time use punctuation mode, which is then followed by the desired punctuation data representation on one of the ten keys numbered one "1" through zero "0", where the preferred "1" key produces a question mark "?", where the preferred "2" key produces a comma ",", where the preferred "3" key produces an exclamation mark "!", where the preferred "4" key produces an open quote """, where the preferred "5" key produces an apostrophe "'", where the preferred "6" key produces a closed quote """, where the preferred "7" key produces an open parenthesis "(", where the preferred "8" key produces a semi-colon ";", where the preferred "9" key produces a closed parenthesis ")"; where the preferred "0" key produces a colon ":". After the activation of the preferred numbered key, the apparatus automatically returns to the previous alphabetic mode.

Activation of the third right preferred number "#" binary control key combined with the activation, either simultaneously with or followed by the activation of the second middle preferred zero "0" binary control key while in the alphabetic mode, returns the keyboard to the number mode.

BRIEF DESCRIPTION OF THE DRAWINGS

Further objects, features, and advantages of the present invention will become apparent upon the consideration of the following detailed description of the presently-preferred embodiment when taken in conjunction with the accompanying drawings, wherein:

FIGS. 2A and 2B show a coding scheme for use on the keypad of FIG. 1 or preferably on the keypad of FIG. 4, filed as a provisional application on 8th day of April, 1997, entitled "ALPHANUMERIC TELEPHONY KEYPAD DATA ENTRY METHOD".

FIGS. 5A and 5B show a preferred continuous upper-case alphabetic coding scheme for use on the keypad of FIG. 1 or preferably on the keypad of FIG. 4.

FIGS. 6A through 6D show a preferred lower-case and upper-case alphabetic coding scheme for use on the keypad of FIG. 1 or preferably on the keypad of FIG. 4.

FIG. 7 shows an example of the activation combinations for the continuous upper-case alphanumeric mode.

FIG. 8 shows an example of the activation combinations for the lower-case and upper-case alphanumeric mode.

DETAILED DESCRIPTION OF THE INVENTION

Figure 1:
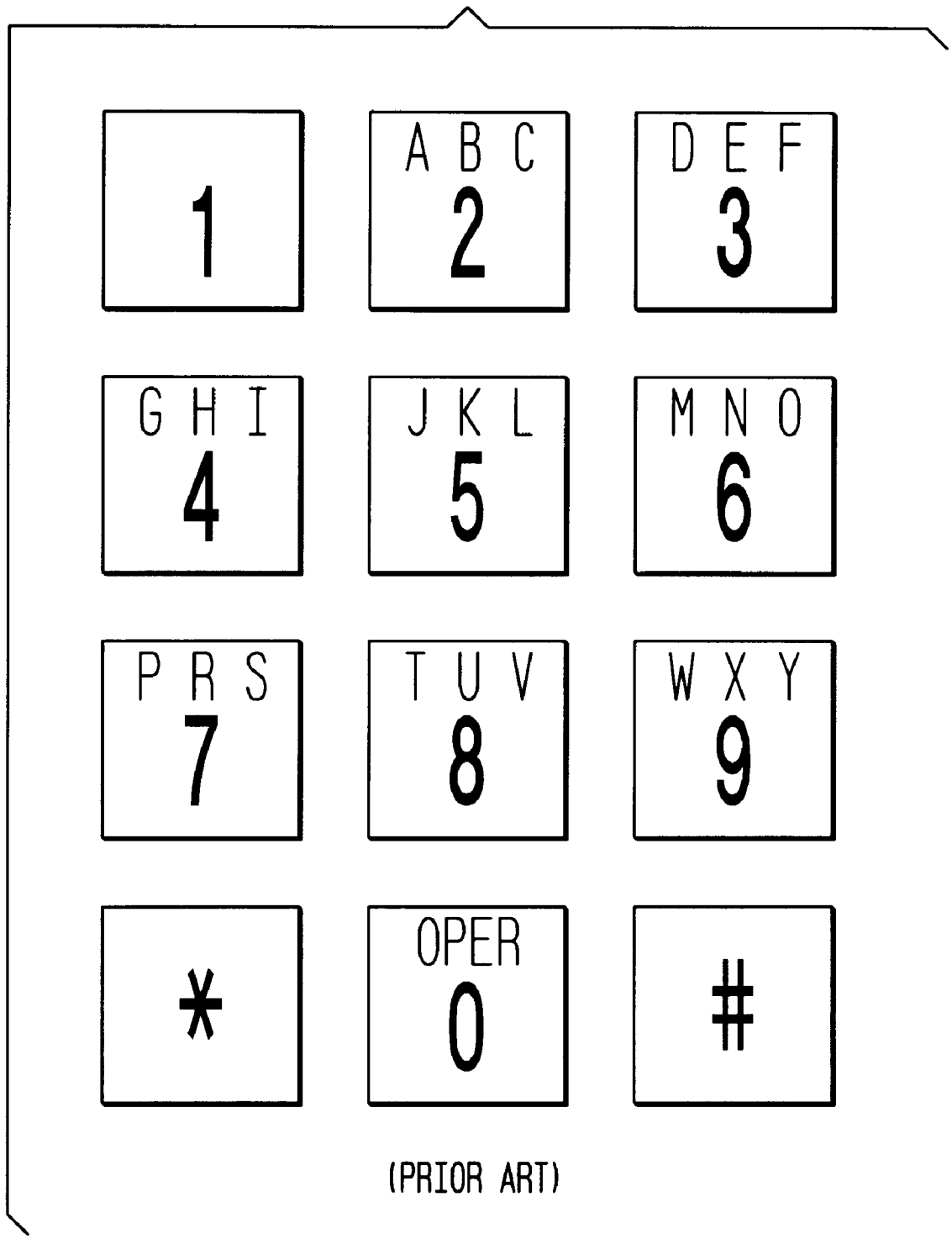
FIG. 1 shows the standard twelve key push-button telephone keypad configuration.
Figure 3:
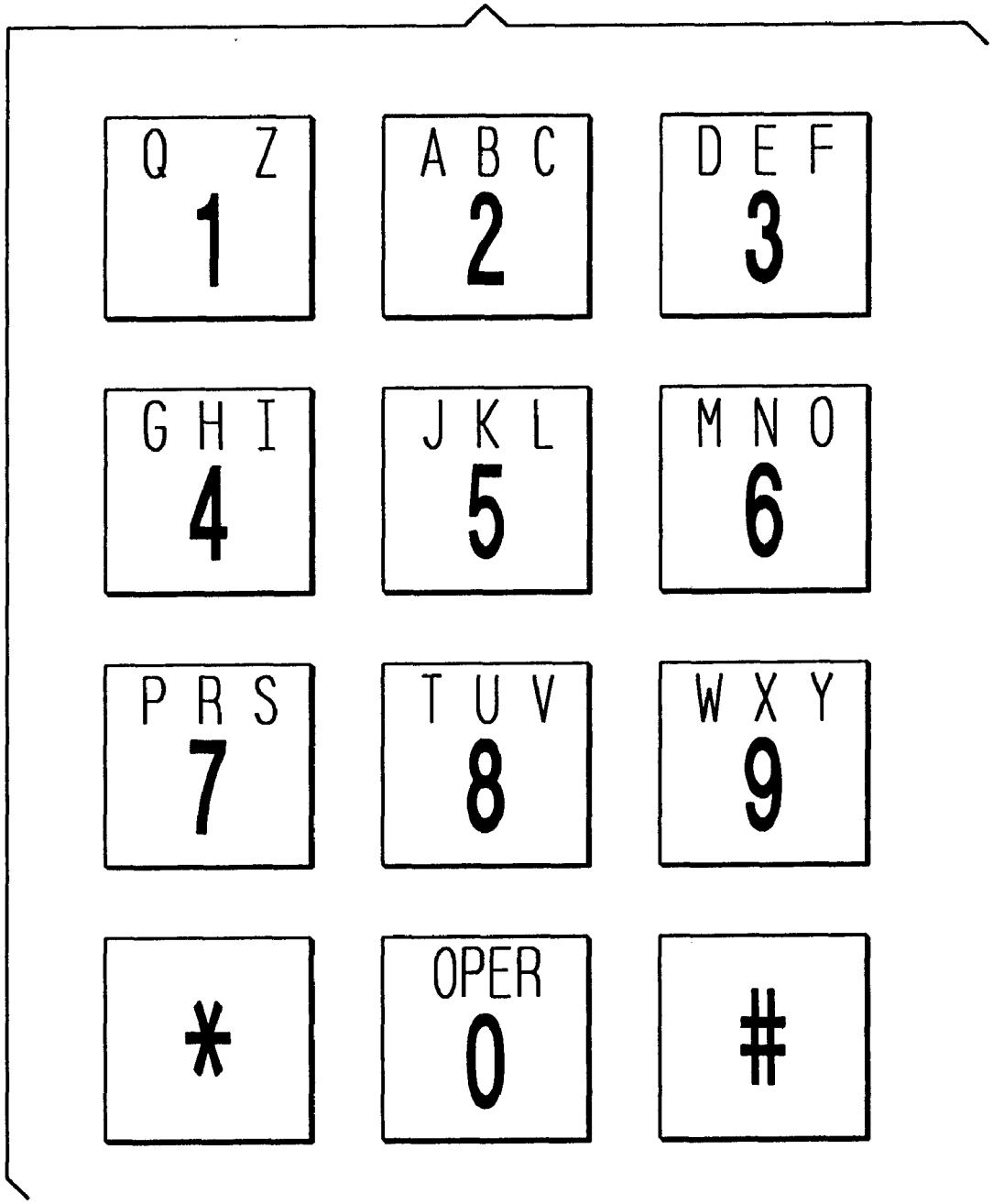
FIG. 3 shows the standard twelve key push-button telephone keypad configuration with the "Q" and "Z" located on the number "1" key with a space " " positioned between the "Q" and "Z."
Figure 4:
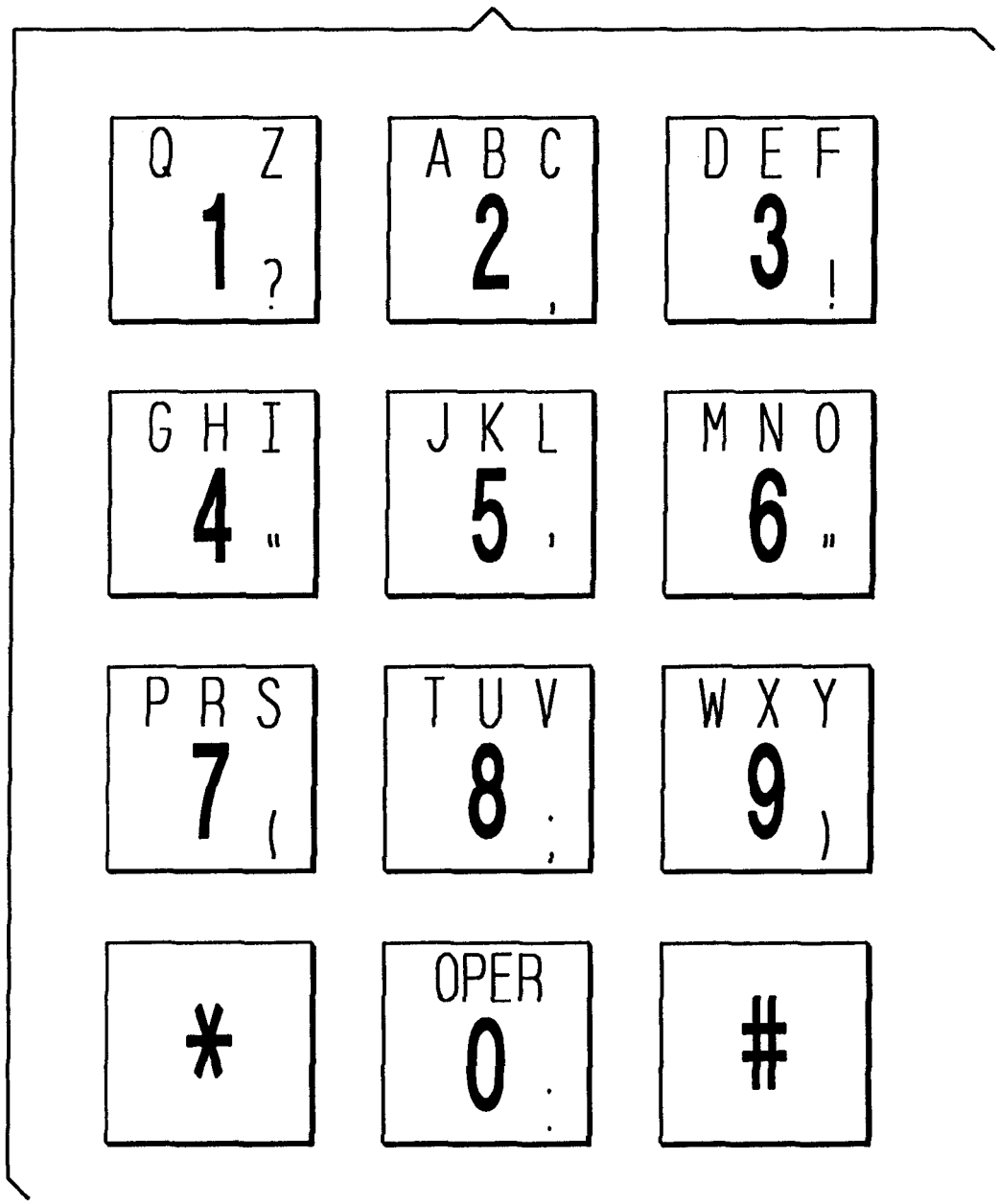
FIG. 4 shows a preferred embodiment for the twelve key push-button telephone keypad, with punctuation marks included.

In the telephone industry, it is well known that the depression of any given button on a standard twelve button telephone keypad generates one of twelve pairs of audio tones on the "touch tone" phone, or its digital data counterpart on a digital phone. This invention takes advantage of the customary arrangement of the markings on the face of the standard push-button telephone keypad. When one numeric button is depressed, while in the standard number mode, it produces the numerical value of the binary key depressed (except for the left asterisk "*" key and the number "#" key).

When the first left preferred asterisk "*" binary control key is depressed once while in the number mode, the apparatus enters a two key continuous upper-case alphabet mode to produce twenty-six letters or characters of an alphabet and a space. Depressing the binary key of a first set of nine binary keys, with the desired alphabetic data, combined with the simultaneous activation or followed by the activation of the first left preferred asterisk "*" binary control key produces the first left position data character, the second middle preferred zero "0" binary control key produces the second middle position data character, or the third right preferred number "#" binary control key produces the third right position data character. The two key preferred embodiment is shown in FIGS. 5A and 5B.

When the first left preferred asterisk "*" binary control key is depressed once while in the number mode, followed by the secondary activation the first left preferred asterisk "*" binary control key, the apparatus enters a two key lower-case and three key upper-case alphabetic mode, to produce twenty-six lower-case letters or characters of an alphabet and a space and twenty-six upper-case letters or characters of an alphabet and a space. Depressing the binary key of a first set of nine binary keys, with the desired alphabetic data, combined with the simultaneous activation or followed by the activation of the first left preferred asterisk "*" binary control key produces the first left position data character, where the secondary activation of the binary control key produces the upper-case character, the second middle preferred zero "0" binary control key produces the second middle position data character, where the secondary activation of the binary control key produces the upper-case character, or the third right preferred number "#" binary control key produces the third right position data character, where the secondary activation of the binary control key produces the upper-case character. The two key lower-case and three key upper-case preferred embodiment is shown in FIGS. 6A through 6D.

The preferred embodiment of the present invention includes:

A method of using a nine key alphanumeric binary keyboard for producing twenty-six letters of an alphabet and a space, comprising nine keys, numbered one "1" through nine "9", combined with a three key binary control keyboard, preferably comprising a first left preferred asterisk "*" binary control key, a second middle preferred zero "0" binary control key, and a third right preferred number "#" binary control key.

The "Q", "space", and "Z" are produced by the preferred number "1" binary key, and the question mark "?" is produced by the activation of the preferred number "1" binary key while in a one-key-entry punctuation mode.

The "A", "B", and "C" are produced by the preferred number "2" binary key, and the comma "," is produced by the activation of the preferred number "2" binary key while in a one-key-entry punctuation mode.

The "D", "E", and "F" are produced by the preferred number "3" binary key, and the exclamation mark "!" is produced by the activation of the preferred number "3" binary key while in a one-key-entry punctuation mode.

The "G", "H", and "I" are produced by the preferred number "4" binary key, and the open quote """ is produced by the activation of the preferred number "4" binary key while in a one-key-entry punctuation mode.

The "J", "K", and "L" are produced by the preferred number "5" binary key, and the apostrophe """ is produced by the activation of the preferred number "5" binary key while in a one-key-entry punctuation mode.

The "M", "N", and "O" are produced by the preferred number "6" binary key, and the closed quote """ is produced by the activation of the preferred number "6" binary key while in a one-key-entry punctuation mode.

The "P", "R", and "S" are produced by the preferred number "7" binary key, and the open parenthesis "(" is produced by the activation of the preferred number "7" binary key while in a one-key-entry punctuation mode.

The "T", "U", and "V" are produced by the preferred number "8" binary key, and the semicolon ";" is produced by the activation of the preferred number "8" binary key while in a one-key-entry punctuation mode.

The "W", "X", and "Y" are produced by the preferred number "9" binary key, and the closed parenthesis ")" is produced by the activation of the preferred number "9" binary key while in a one-key-entry punctuation mode.

The colon ":" is produced by the activation of the second middle preferred zero "0" binary control binary key while in a one-key-entry punctuation mode.

Numbers are produced by using the standard one button activation on the ten numeric keys while in the number mode.

To produce a hyphen "-" between numbers, found in phone numbers, the first left preferred asterisk "*" binary control key is combined with the activation, either simultaneously with or followed by the activation of the third right preferred number "#" binary control key. The telephonic apparatus automatically stays in the number mode.

To produce a decimal point "." found between numbers, while in the number mode, the first left preferred asterisk "*" binary control key is combined with the activation, either simultaneously with or followed by the activation of the second middle preferred zero "0" binary control key. The telephonic apparatus automatically stays in the number mode.

To produce a backspace while in the number mode, the third right preferred number "#" binary control key is activated once, when it is not followed by the activation of a first binary control key or a second binary control key,.

To delete all previously entered numeric data while in the number mode, the third right preferred number "#" binary control key is activated, when it is not followed by the activation of a first binary control key or a second binary control key, followed by the secondary activation of the third right preferred number "#" binary control key, when it is not followed by the activation of a first binary control key or a second binary control key,.

Activation of the third right preferred number "#" binary control key three times, while in the number mode or alphabet mode, produces the "ENTER/RETURN/SEND" function.

Activation of the first left preferred asterisk "*" binary control key, while in the number mode, when not followed by the activation of second middle preferred zero "0" binary control key or the activation of the third right preferred number "#" binary control key, exits the number mode and enters a two key upper-case alphabet mode.

Activation of the first left preferred asterisk "*" binary control key followed by the secondary activation of the first left preferred asterisk "*" binary control key, when not followed by the activation of second middle preferred zero "0" binary control key or the activation of the third right preferred number "#" binary control key, while in the number mode, exits the number mode and enters a two key lower-case alphabet mode and a three key upper-case alphabet mode, where the secondary activation of the binary control key produces the upper-case character.

The present invention provides a method for entering alphabetic data characters including a space, produced by one of nine binary keys numbered one "1" through nine "9", combined with the activation, either simultaneously with or followed by one of three binary control keys; preferably the first left preferred asterisk "*" binary control key, the second middle preferred zero "0" binary control key, or the third right preferred number "#" binary control key.

The "A" is produced by the activation of the preferred "2" key combined with the activation, either simultaneously with or followed by the activation of the first left preferred asterisk "*" binary control key.

The "B" is produced by the activation of the preferred "2" key combined with the activation, either simultaneously with or followed by the activation of the second middle preferred zero "0" binary control key.

The "C" is produced by the activation of the preferred "2" key combined with the activation, either simultaneously with or followed by the activation of the third right preferred number "#" binary control key.

The "D" is produced by the activation of the preferred "3" key combined with the activation, either simultaneously with or followed by the activation of the first left preferred asterisk "*" binary control key.

The "E" is produced by the activation of the preferred "3" key combined with the activation, either simultaneously with or followed by the activation of the second middle preferred zero "0" binary control key.

The "F" is produced by the activation of the preferred "3" key combined with the activation, either simultaneously with or followed by the activation of the third right preferred number "#" binary control key.

The "G" is produced by the activation of the preferred "4" key combined with the activation, either simultaneously with or followed by the activation of the first left preferred asterisk "#" binary control key.

The "H" is produced by the activation of the preferred "4" key combined with the activation, either simultaneously with or followed by the activation of the second middle preferred zero "0" binary control key.

The "I" is produced by the activation of the preferred "4" key combined with the activation, either simultaneously with or followed by the activation of the third right preferred number "#" binary control key.

The "J" is produced by the activation of the preferred "5" key combined with the activation, either simultaneously with or followed by the activation of the first left preferred asterisk "*" binary control key.

The "K" is produced by the activation of the preferred "5" key combined with the activation, either simultaneously with or followed by the activation of the second middle preferred zero "0" binary control key.

The "L" is produced by the activation of the preferred "5" key combined with the activation, either simultaneously with or followed by the activation of the third right preferred number "#" binary control key.

The "M" is produced by the activation of the preferred "6" key combined with the activation, either simultaneously with or followed by the activation of the first left preferred asterisk "*" binary control key.

The "N" is produced by the activation of the preferred "6" key combined with the activation, either simultaneously with or followed by the activation of the second middle preferred zero "0" binary control key.

The "O" is produced by the activation of the preferred "6" key combined with the activation, either simultaneously with or followed by the activation of the third right preferred number "#" binary control key.

The "P" is produced by the activation of the preferred "7" key combined with the activation, either simultaneously with or followed by the activation of the first left preferred asterisk "*" binary control key.

The "Q" is produced by the activation of the preferred "1" key combined with the activation, either simultaneously with or followed by the activation of the first left preferred asterisk "*" binary control key.

The "R" is produced by the activation of the preferred "7" key combined with the activation, either simultaneously with or followed by the activation of the second middle preferred zero "0" binary control key.

The "S" is produced by the activation of the preferred "7" key combined with the activation, either simultaneously with or followed by the activation of the third right preferred number "#" binary control key.

The "T" is produced by the activation of the preferred "8" key combined with the activation, either simultaneously with or followed by the activation of the first left preferred asterisk "*" binary control key.

The "U" is produced by the activation of the preferred "8" key combined with the activation, either simultaneously with or followed by the activation of the second middle preferred zero "0" binary control key.

The "V" is produced by the activation of the preferred "8" key combined with the activation, either simultaneously with or followed by the activation of the third right preferred number "#" binary control key.

The "W" is produced by the activation of the preferred "9" key combined with the activation, either simultaneously with or followed by the activation of the first left preferred asterisk "*" binary control key.

The "X" is produced by the activation of the preferred "9" key combined with the activation, either simultaneously with or followed by the activation of the second middle preferred zero "0" binary control key.

The "Y" is produced by the activation of the preferred "9" key combined with the activation, either simultaneously with or followed by the activation of the third right preferred number "#" binary control key.

The "Z" is produced by the activation of the preferred "1" key combined with the activation, either simultaneously with or followed by the activation of the third right preferred number "#" binary control key.

The "space" is produced by the activation of the preferred "1" key combined with the activation, either simultaneously with or followed by the activation of the second middle preferred zero "0" binary control key.

The present invention also provides a method for entering upper-case and lower-case alphabetic data, including the space, produced by eon of nine binary keys numbered one "1" through nine "9", combined with the activation, either simultaneously with or followed by eon of the three binary control keys, preferably the first left preferred asterisk "*" binary control key, the second middle preferred zero "0" binary control key, and the third right preferred number "#" binary control key. Secondary activation of the binary control key, produces an upper-case letter.

The lower-case "a" is produced by the activation of the preferred "2" key combined with the activation, either simultaneously with or followed by the activation of the first left preferred asterisk "*" binary control key; and the upper-case "A" is produced by the activation of the preferred "2" key combined with the activation, either simultaneously with or followed by the activation of the first left preferred asterisk "*" binary control key, followed by the secondary activation of the first left preferred asterisk "*" binary control key.

The lower-case "b" is produced by the activation of the preferred "2" key combined with the activation, either simultaneously with or followed by the activation of the second middle preferred zero "0" binary control key; and the upper-case "B" is produced by the activation of the preferred "2" key combined with the activation, either simultaneously with or followed by the activation of the second middle preferred zero "0" binary control key, followed by the secondary activation of the second middle preferred zero "0" binary control key.

The lower-case "c" is produced by the activation of the preferred "2" key combined with the activation, either simultaneously with or followed by the activation of the third right preferred number "#" binary control key; and the upper-case "C" is produced by the activation of the preferred "2" key combined with the activation, either simultaneously with or followed by the activation of the third right preferred number "#" binary control key, followed by the secondary activation of the third right preferred number "#" binary control key.

The lower-case "d" is produced by the activation of the preferred "3" key combined with the activation, either simultaneously with or followed by the activation of the first left preferred asterisk "*" binary control key; and the upper-case "D" is produced by the activation of the preferred "3" key combined with the activation, either simultaneously with or followed by the activation of the first left preferred asterisk "*" binary control key, followed by the secondary activation of the first left preferred asterisk "*" binary control key.

The lower-case "e" is produced by the activation of the preferred "3" key combined with the activation, either simultaneously with or followed by the activation of the second middle preferred zero "0" binary control key; and the upper-case "E" is produced by the activation of the preferred "3" key combined with the activation, either simultaneously with or followed by the activation of the second middle preferred zero "0" binary control key, followed by the secondary activation of the second middle preferred zero "0" binary control key.

The lower-case "f" is produced by the activation of the preferred "3" key combined with the activation, either simultaneously with or followed by the activation of the third right preferred number "#" binary control key; and the upper-case "F" is produced by the activation of the preferred "3" key combined with the activation, either simultaneously with or followed by the activation of the third right preferred number "#" binary control key, followed by the secondary activation of the third right preferred number "#" binary control key.

The lower-case "g" is produced by the activation of the preferred "4" key combined with the activation, either simultaneously with or followed by the activation of the first left preferred asterisk "*" binary control key; and the upper-case "G" is produced by the activation of the preferred "4" key combined with the activation, either simultaneously with or followed by the activation of the first left preferred asterisk "*" binary control key, followed by the secondary activation of the first left preferred asterisk "*" binary control key.

The lower-case "h" is produced by the activation of the preferred "4" key combined with the activation, either simultaneously with or followed by the activation of the second middle preferred zero "0" binary control key; and the upper-case "H" is produced by the activation of the preferred "4" key combined with the activation, either simultaneously with or followed by the activation of the second middle preferred zero "0" binary control key, followed by the secondary activation of the second middle preferred zero "0" binary control key.

The lower-case "i" is produced by the activation of the preferred "4" key combined with the activation, either simultaneously with or followed by the activation of the third right preferred number "#" binary control key; and the upper-case "I" is produced by the activation of the preferred "4" key combined with the activation, either simultaneously with or followed by the activation of the third right preferred number "#" binary control key, followed by the secondary activation of the third right preferred number "#" binary control key.

The lower-case "j" is produced by the activation of the preferred "5" key combined with the activation, either simultaneously with or followed by the activation of the first left preferred asterisk "*" binary control key; and the upper-case "J" is produced by the activation of the preferred "5" key combined with the activation, either simultaneously with or followed by the activation of the first left preferred asterisk "*" binary control key, followed by the secondary activation of the first left preferred asterisk "*" binary control key.

The lower-case "k" is produced by the activation of the preferred "5" key combined with the activation, either simultaneously with or followed by the activation of the second middle preferred zero "0" binary control key; and the upper-case "K" is produced by the activation of the preferred "5" key combined with the activation, either simultaneously with or followed by the activation of the second middle preferred zero "0" binary control key, followed by the secondary activation of the second middle preferred zero "0" binary control key.

The lower-case "l" is produced by the activation of the preferred "5" key combined with the activation, either simultaneously with or followed by the activation of the third right preferred number "#" binary control key; and the upper-case "L" is produced by the activation of the preferred "5" key combined with the activation, either simultaneously with or followed by the activation of the third right preferred number "#" binary control key, followed by the secondary activation of the third right preferred number "#" binary control key.

The lower-case "m" is produced by the activation of the preferred "6" key combined with the activation, either simultaneously with or followed by the activation of the first left preferred asterisk "*" binary control key; and the upper-case "M" is produced by the activation of the preferred "6" key combined with the activation, either simultaneously with or followed by the activation of the first left preferred asterisk "*" binary control key, followed by the secondary activation of the first left preferred asterisk "*" binary control key.

The lower-case "n" is produced by the activation of the preferred "6" key combined with the activation, either simultaneously with or followed by the activation of the second middle preferred zero "0" binary control key; and the upper-case "N" is produced by the activation of the preferred "6" key combined with the activation, either simultaneously with or followed by the activation of the second middle preferred zero "0" binary control key, followed by the secondary activation of the second middle preferred zero "0" binary control key.

The lower-case "o" is produced by the activation of the preferred "6" key combined with the activation, either simultaneously with or followed by the activation of the third right preferred number "#" binary control key; and the upper-case "O" is produced by the activation of the preferred "6" key combined with the activation, either simultaneously with or followed by the activation of the third right preferred number "#" binary control key, followed by the secondary activation of the third right preferred number "#" binary control key.

The lower-case "p" is produced by the activation of the preferred "7" key combined with the activation, either simultaneously with or followed by the activation of the first left preferred asterisk "*" binary control key; and the upper-case "P" is produced by the activation of the preferred "7" key combined with the activation, either simultaneously with or followed by the activation of the first left preferred asterisk "*" binary control key, followed by the secondary activation of the first left preferred asterisk "*" binary control key.

The lower-case "q" is produced by the activation of the preferred "1" key combined with the activation, either simultaneously with or followed by the activation of the first left preferred asterisk "*" binary control key; and the upper-case "Q" is produced by the activation of the preferred "1" key combined with the activation, either simultaneously with or followed by the activation of the first left preferred asterisk "*" binary control key, followed by the secondary activation of the first left preferred asterisk "*" binary control key.

The lower-case "r" is produced by the activation of the preferred "7" key combined with the activation, either simultaneously with or followed by the activation of the second middle preferred zero "0" binary control key; and the upper-case "R" is produced by the activation of the preferred "7" key combined with the activation, either simultaneously with or followed by the activation of the second middle preferred zero "0" binary control key, followed by the secondary activation of the second middle preferred zero "0" binary control key.

The lower-case "s" is produced by the activation of the preferred "7" key combined with the activation, either simultaneously with or followed by the activation of the third right preferred number "#" binary control key; and the upper-case "S" is produced by the activation of the preferred "7" key combined with the activation, either simultaneously with or followed by the activation of the third right preferred number "#" binary control key, followed by the secondary activation of the third right preferred number "#" binary control key.

The lower-case "t" is produced by the activation of the preferred "8" key combined with the activation, either simultaneously with or followed by the activation of the first left preferred asterisk "*" binary control key; and the upper-case "T" is produced by the activation of the preferred "8" key combined with the activation, either simultaneously with or followed by the activation of the first left preferred asterisk "*" binary control key, followed by the secondary activation of the first left preferred asterisk "*" binary control key.

The lower-case "u" is produced by the activation of the preferred "8" key combined with the activation, either simultaneously with or followed by the activation of the second middle preferred zero "0" binary control key; and the upper-case "U" is produced by the activation of the preferred "8" key combined with the activation, either simultaneously with or followed by the activation of the second middle preferred zero "0" binary control key, followed by the secondary activation of the second middle preferred zero "0" binary control key.

The lower-case "v" is produced by the activation of the preferred "8" key combined with the activation, either simultaneously with or followed by the activation of the third right preferred number "#" binary control key; and the upper-case "V" is produced by the activation of the preferred "8" key combined with the activation, either simultaneously with or followed by the activation of the third right preferred number "#" binary control key, followed by the secondary activation of the third right preferred number "#" binary control key.

The lower-case "w" is produced by the activation of the preferred "9" key combined with the activation, either simultaneously with or followed by the activation of the first left preferred asterisk "*" binary control key; and the upper-case "W" is produced by the activation of the preferred "9" key combined with the activation, either simultaneously with or followed by the activation of the first left preferred asterisk "*" binary control key, followed by the secondary activation of the first left preferred asterisk "*" binary control key.

The lower-case "x" is produced by the activation of the preferred "9" key combined with the activation, either simultaneously with or followed by the activation of the second middle preferred zero "0" binary control key; and the upper-case "X" is produced by the activation of the preferred "9" key combined with the activation, either simultaneously with or followed by the activation of the second middle preferred zero "0" binary control key, followed by the secondary activation of the second middle preferred zero "0" binary control key.

The lower-case "y" is produced by the activation of the preferred "9" key combined with the activation, either simultaneously with or followed by the activation of the third right preferred number "#" binary control key; and the upper-case "Y" is produced by the activation of the preferred "9" key combined with the activation, either simultaneously with or followed by the activation of the third right preferred number "#" binary control key, followed by the secondary activation of the third right preferred number "#" binary control key.

The lower-case "z" is produced by the activation of the preferred "1" key combined with the activation, either simultaneously with or followed by the activation of the third right preferred number "#" binary control key; and the upper-case "Z" is produced by the activation of the preferred "1" key combined with the activation, either simultaneously with or followed by the activation of the third right preferred number "#" binary control key, followed by the secondary activation of the third right preferred number "#" binary control key.

The "space" is produced by the activation of the preferred "1" key combined with the activation, either simultaneously with or followed by the activation of the second middle preferred zero "0" binary control key.

Activation of the second middle preferred zero "0" binary control key, while in the alphabetic mode, followed by the activation of the second middle preferred zero "0" binary control key, also produces a space.

Activation of the second middle preferred zero "0" binary control key three times, while in the alphabetic mode, produces the "TAB" function.

Activation of the first left preferred asterisk "*" binary control key, while in the alphabetic mode, followed by the first left preferred asterisk "*" binary control key, deletes the previously-entered bit of data, otherwise known as the backspace.

Activation of the first left preferred asterisk "*" binary control key three times, while in the alphabetic mode, deletes the previously entered word.

Activation of the first left preferred asterisk "*" binary control key, while in the alphabetic mode, combined with the activation, either simultaneously with or followed by the second middle preferred zero "0" binary control key, produces a period ".".

Activation of the first left preferred asterisk "*" binary control key, while in the alphabetic mode, combined with the activation, either simultaneously with or followed by the activation of the third right preferred number "#" binary control key, enters a one-time use punctuation mode, followed by the desired punctuation data key representation of the ten keys numbered one "1" through zero "0", where the activation of the preferred "1" key produces a question mark "?", where the activation of the preferred "2" key produces a comma ",", where the activation of the preferred "3" key produces an exclamation mark "!", where the activation of the preferred "4" key produces an open quote """, where the activation of the preferred "5" key produces an apostrophe """, where the activation of the preferred "6" key produces a closed quote """, where the activation of the preferred "7" key produces an open parenthesis "(", where the activation of the preferred "8" key produces a semi-colon ";", where the activation of the preferred "9" key produces a closed parenthesis ")", where the activation of the preferred "0" key produces a colon ":", where then the telephonic apparatus returns to the previous alphabetic mode.

Activation of the third right preferred number "#" binary control key combined with the activation, either simultaneously with or followed by the activation of the second middle preferred zero "0" binary control key while in the alphabetic mode, returns the keyboard to the number mode.

A latitude of modification, change, and substitution is intended in the foregoing disclosure, and in some instances, some features of the invention will be employed without a corresponding use of other features. Accordingly, it is appropriate that the appended claims be construed broadly and in a manner consistent with the spirit and scope of the invention herein.

I claim:

1. A method of using a twelve key binary keyboard having a first set of nine binary keys numbered one "1" through nine "9", used as an alphanumeric binary keyboard, with twenty-six characters and a space grouped in sets of three's on all nine keys, combined with a second set of three binary control keys including, a first binary control key, a second binary control key and a third binary control key, using a control means comprising the steps of:

a) activating one binary key of said first set of nine binary keys numbered one "1" through nine "9" or activating said second binary control key of said second set of three binary control keys, numbered zero "0", for producing a one key numeric value while in a standard number mode;

b) wherein activating said third binary control key, while in said number mode, when not followed by the activation of said first binary control or said second binary control key, followed by the secondary activation of said third binary control key, when not followed by the activation of said first binary control key or said second binary control key, deletes all numeric data;

c) activating said first binary control key only of said second set of three binary control keys for exiting said standard number mode and for entering a two key upper-case alphabet mode with twenty-seven data characters, including a space and one of twenty-six data characters of an alphabet;

d) activating one binary key of said first set of nine binary keys numbered one "1" through nine "9" combined with activating one binary control key of said second set of three binary control keys for producing one of said twenty-seven data characters;

e) producing one of three data characters represented on each binary key of said first set of nine binary keys numbered one "1" through nine "9", while in said alphabet mode, by selecting a data character, of three possible data characters;

producing a first position upper-case data character by activating the desired data character's binary key combined with activating said first binary control key of said second set of three binary control keys, producing a second position upper-case data character by activating of the desired data character's binary key combined with activating said second binary control key of said second set of three binary control keys, producing a third position upper-case data character by activating of the desired data character's binary key combined with activating said third binary control key of said second set of three binary control keys, f) wherein activating said first binary control key, while in said alphabet mode, followed by the secondary activation of said first binary control key, followed be the trinary activation of said first binary control key, deletes the previously entered word;

g) activating said third binary control key combined with activating said second binary control key, of said three key binary control set, for exiting said alphabet mode and returning to said number mode.

2. The method of using said nine key binary keyboard combined with said three key binary control keyboard in accordance with claim 1, where said first binary control key is preferably an asterisk "*" key, said second binary control key is a zero "0" key and said third binary control key is preferably a number symbol "#" key.

3. The method of using said nine key binary keyboard combined with said three key binary control keyboard in accordance with claim 1, wherein activating said first binary control key, while in said number mode, combined with activating said third binary control key, produces a hyphen "-" found between numbers in a phone number.

4. The method of using said nine key binary keyboard combined with said three key binary control keyboard in accordance with claim 1, wherein activating said first binary control key, while in said number mode, combined with activating said second binary control key, produces a decimal "." found between numbers.

5. The method of using said nine key binary keyboard combined with said three key binary control keyboard in accordance with claim 1, wherein activating said third binary control key, while in said number mode, when not followed by the activation of said first binary control key or said second binary control key, produces a backspace.

6. The method of using said nine key binary keyboard combined with said three key binary control keyboard in accordance with claim 1, wherein activating said third binary control key, while in said number mode or alphabet mode, when not followed by the activation of said first binary control key or said second binary control key, followed by the secondary activation of said third binary control key, when not followed by the activation of said first binary control key or said second binary control key, followed by the trinary activation of said third binary control key, enters the alphanumeric data.

7. The method of using said nine key binary keyboard combined with said three key binary control keyboard in accordance with claim 1, wherein activating said second binary control key, while in said alphabet mode, followed by the secondary activation of said second binary control key, produces a space.

8. The method of using said nine key binary keyboard combined with said three key binary control keyboard in accordance with claim 1, wherein activating said second binary control key, while in said alphabet mode, followed by the secondary activation of said second binary control key, followed by the trinary activation of said second binary control key, produces the tab function.

9. The method of using said nine key binary keyboard combined with said three key binary control keyboard in accordance with claim 1, wherein activating said first binary control key, while in said alphabet mode, combined with activating said second binary control key, produces a period ".".

10. The method of using said nine key binary keyboard combined with said three key binary control keyboard in accordance with claim 1, wherein activating said first binary control key, while in the alphabetic mode, combined with activating said third binary control key, enters a one-time use punctuation mode, which returns automatically to said previous alphabet mode after the desired punctuation key, produced by ten numeric keys, numbered one "1" through nine "9" and zero "0", is activated;

where said "1" key produces a question mark "?",
where said "2" key produces a comma ",",
where said "3" key produces an exclamation mark "!",
where said "4" key produces a open quote """,
where said "5" key produces an apostrophe "'",
where said "6" key produces a closed quote """,
where said "7" key produces an open parenthesis "(",
where said "8" key produces a semi-colon ";",
where said "9" key produces a closed parenthesis ")",
where said "0" key produces a colon ":".

11. The method of using said nine key binary keyboard combined with said three key binary control keyboard in accordance with claim 1, wherein activating said first binary control key, while in the alphabet mode, followed by the secondary activation of said first binary control key, deletes the previously entered alphabetic or punctuation data, otherwise known as the backspace.

12. The method of using said nine key binary keyboard combined with said three key binary control keyboard in accordance with claim 1, wherein said first set of nine binary keys combined with said second set of three binary control keys, produces a nine bit binary code combined with a three bit binary code.

13. A method of using a twelve key binary keyboard having a first set of nine binary keys numbered one "1" through nine "9", used as an alphanumeric binary keyboard, with twenty-six characters and a space grouped in sets of three's on all nine keys, combined with a second set of three binary control keys including, a first binary control key, a second binary control key and a third binary control key, using a control means comprising the steps of:

a) activating one binary key of said first set of nine binary keys numbered one "1" through nine "9" or activating said second binary control key of said second set of three binary control keys, numbered zero "0", for producing a one key numeric value while in a standard number mode;

b) wherein activating said third binary control key, while in said number mode, when not followed by the activation of said first binary control or said second binary control key, followed by the secondary activation of said third binary control key, when not followed be the activation of said first binary control key or said second binary control key, deletes all numeric data;

c) activating said first binary control key only of said second set of three binary control keys, followed by the secondary activation of said first binary control key of said second set of three binary control keys, for exiting said standard number mode and for entering a two key lower-case and three key upper-case alphabet mode with twenty-seven data characters, including a space and one of twenty-six data characters of a lower-case alphabet or a space and one of twenty-six data characters of a upper-case alphabet;

d) activating one binary key of said first set of nine binary keys numbered one "1" through nine "9" combined with activating one binary control key of said second set of three binary control keys for producing one of said twenty-seven data characters or one of said twenty-seven three key data characters or one of said twenty-seven three key data characters;

e) producing one of three data characters represented on each binary key of said first set of nine binary keys numbered one "1" through nine "9", while in said alphabet mode, by selecting a data character, of three possible data characters;

producing a first position lower-case data character by activating the desired data character's binary key combined with activating said first binary control key of said second set of three binary control keys, producing a second position lower-case data character by activating of the desired data character's binary key combined with activating said second binary control key of said second set of three binary control keys, producing a third position lower-case data character by activating of the desired data character's binary key combined with activating said third binary control key of said second set of three binary control keys, producing a first position upper-case data character by activating the desired data character's binary key combined with said first binary control key of said second set of three binary control keys, followed by the secondary activation of said first binary control key, producing a second position upper-case data character by activating the desired data character's binary key combined with said second binary control key of said second set of three binary control keys, followed by the secondary activation of said second binary control key, producing a third position upper-case data character by activating the desired data character's binary key combined with said third binary control key of said second set of three binary control keys, followed by the secondary activation of said third binary control key, f) wherein activating said first binary control key, while in said alphabet mode, followed by the secondary activation of said first binary control key, followed by the trinary activation of said first binary control key, deletes the previously entered word;

g) activating said third binary control key combined with activating said second binary control key, of said three key binary control set, for exiting said alphabet mode and returning to said number mode.

14. The method of using said nine key binary keyboard combined with said three key binary control keyboard in accordance with claim 13, where said first binary control key is preferably an asterisk "*" key, said second binary control key is a zero "0" key and said third binary control key is preferably a number symbol "#" key.

15. The method of using said nine key binary keyboard combined with said three key binary control keyboard in accordance with claim 13, wherein activating said first binary control key, while in said number mode, combined with activating said third binary control key, produces a hyphen "-" found between numbers in a phone number.

16. The method of using said nine key binary keyboard combined with said three key binary control keyboard in accordance with claim 13, wherein activating said first binary control key, while in said number mode, combined with activating said second binary control key, produces a decimal "." found between numbers.

17. The method of using said nine key binary keyboard combined with said three key binary control keyboard in accordance with claim 13, wherein activating said third binary control key, while in said number mode, when not followed by the activation of said first binary control key or said second binary control key, produces a backspace.

18. The method of using said nine key binary keyboard combined with said three key binary control keyboard in accordance with claim 13, wherein activating said third binary control key, while in said number mode or alphabet mode, when not followed by the activation of said first binary control key or said second binary control key, followed by the secondary activation of said third binary control key, when not followed by the activation of said first binary control key or said second binary control key, followed by the trinary activation of said third binary control key, enters the alphanumeric data.

19. The method of using said nine key binary keyboard combined with said three key binary control keyboard in accordance with claim 13, wherein activating said second binary control key, while in said alphabet mode, followed by the secondary activation of said second binary control key, produces a space.

20. The method of using said nine key binary keyboard combined with said three key binary control keyboard in accordance with claim 13, wherein activating said second binary control key, while in said alphabet mode, followed by the secondary activation of said second binary control key, followed by the trinary activation of said second binary control key, produces the tab function.

21. The method of using said nine key binary keyboard combined with said three key binary control keyboard in accordance with claim 13, wherein activating said first binary control key, while in said alphabet mode, combined with activating said second binary control key, produces a period ".".

22. The method of using said nine key binary keyboard combined with said three key binary control keyboard in accordance with claim 13, wherein activating said first binary control key, while in the alphabetic mode, combined with activating said third binary control key, enters a one-time use punctuation mode, which returns automatically to said previous alphabet mode after the desired punctuation key, produced by ten numeric keys, numbered one "1" through nine "9" and zero "0", is activated;

where said "1" key produces a question mark "?", where said "2" key produces a comma ",", where said "3" key produces an exclamation mark "!", where said "4" key produces a open quote """, where said "5" key produces an apostrophe "'", where said "6" key produces a closed quote """, where said "7" key produces an open parenthesis "(", where said "8" key produces a semi-colon ";", where said "9" key produces a closed parenthesis ")", where said "0" key produces a colon ":"

23. The method of using said nine key binary keyboard combined with said three key binary control keyboard in accordance with claim 13, wherein activating said first binary control key, while in the alphabet mode, followed by the secondary activation of said first binary control key, deletes the previously entered alphabetic or punctuation data, otherwise known as the backspace.

24. The method of using said nine key binary keyboard combined with said three key binary control keyboard in accordance with claim 13, wherein said first set of nine binary keys combined with said second set of three binary control keys, produces a nine bit binary code combined with a three bit binary code.

* * * * *